United States Patent [19]
Porter et al.

[11] Patent Number: 5,191,303
[45] Date of Patent: Mar. 2, 1993

[54] HIGH SPEED PROBE ATTENUATOR

[75] Inventors: Matthew A. Porter, Molalla; Dale A. Ellenwood, Beaverton, both of Oreg.

[73] Assignee: Tektronix, Inc., Wilsonville, Oreg.

[21] Appl. No.: 757,411

[22] Filed: Sep. 10, 1991

[51] Int. Cl.$^5$ .............................................. H01P 1/22
[52] U.S. Cl. ............................... 333/81 R; 333/81 A; 333/24.2; 333/24 C; 323/370; 338/229
[58] Field of Search ............... 333/81 R, 81 A, 81 B, 333/23, 24 R, 24.2, 24.3, 140, 24 C; 338/216, 229; 323/369, 370

[56] References Cited
U.S. PATENT DOCUMENTS
3,753,170  8/1973  Holland ........................... 333/81 R

*Primary Examiner*—Paul M. Dzierzynski
*Assistant Examiner*—Ali Neyzari
*Attorney, Agent, or Firm*—Francis I. Gray; Boulden G. Griffith

[57] ABSTRACT

A high speed probe attenuator has an attenuator with a plurality of resistors connected in series between a probe input and an instrument output. A plurality of capacitors are coupled in parallel with pairs of the resistors in an interleaved fashion to spread the frequency correction along the attenuator. The output of the attenuator is coupled by a large diameter coaxial cable to a test instrument. The result is a high speed probe with no dribble-up effect and no overshoot.

5 Claims, 3 Drawing Sheets

HIGH SPEED PROBE ATTENUATOR

BACKGROUND OF THE INVENTION

The present invention relates to probe attenuators, and more particularly to a high speed probe attenuator for use especially with video display drivers that provides an idealized response without "dribble-up" effects or overshoot.

For test and measurement instruments probes are used to connect the instrument to a test point on an electronic device being tested. For best results the probes should not introduce any anomalies into an electrical signal as it exists at the test point so that the appearance on the instrument display is a true representation of the signal. With analog signals the bandwidth does not need to be as high as with digital signals. However digital signals have steep transition characteristics between states, so that a much higher bandwidth is required to minimize anomalies introduced by the probe. Further in certain analog applications where very short duration pulses are generated, such as certain optical and high energy physics applications, a much higher bandwidth also is required to capture a true representation of the signal.

Prior probes, such as the P6057 and P6156 low impedance probes manufactured by Tektronix, Inc. of Beaverton, Oreg., United States of America, have specific problems that limit their use for such applications. For example the P6057 is very fragile and breaks easily due to an internal resistor in the probe barrel that is sensitive to pressure and torque. This probe is hard to calibrate and it is impossible to obtain two probes with the same response. The major flaw is the "dribble-up" effect, as shown in FIG. 2, caused by the "skin effect" of a small diameter (<RG174) coaxial cable used for interconnecting the probe to the instrument. This dribble-up effect, due to an extra resistor in the coaxial connector, results in an overshoot at the leading edge of a pulse signal together with a subsequent gradual rise to the final level of the signal. The frequency response of the P6057 is D.C. to 1.4 GHz with approximately eight percent overshoot.

The P6156 is designed to replace the P6057, and is fairly rugged mechanically. However this probe has overpeaking added in its response that adversely affects performance. Although these probes are very repeatable, they still have the dribble-up effect caused by the small diameter coaxial cable. The frequency response is D.C. to 3.5 GHz with nineteen percent overshoot.

A typical circuit configuration for these prior art probe attenuators is shown in FIG. 1. A thick film substrate, typically of ceramic, has a large resistor laid on top coupled in series with a small resistor. An added capacitor is coupled in parallel with the small resistor, and a parallel parasitic capacitor, in the form of a pair of plates below the substrate and above a portion of the large resistor coupled together through a via, is coupled in parallel with the portion of the large resistor.

What is desired is a high speed probe attenuator that has a high frequency response without demonstrating dribble-up or appreciable overshoot.

SUMMARY OF THE INVENTION

Accordingly the present invention provides a high speed probe attenuator that has a high frequency response with no dribble-up effect or overshoot. The probe attenuator uses a large diameter coaxial cable to reduce signal loss due to skin effect, and is electrically divided into a plurality of sections. Using thin-film technology a plurality of series resistors are laid on a substrate that is contained within an electrically conductive housing to form a transmission line. The resistors are coupled between an input bond pad and an output bond pad. Capacitors are coupled between pairs of the resistors in an interleaved fashion to add appropriate frequency compensation, resulting in the use of smaller individual elements that are spread out over the attenuator structure. Stray capacitance between the housing, which is grounded, and the resistors also affects the frequency response so that the capacitive elements may be smaller.

The objects, advantages and other novel features of the present invention are apparent from the following detailed description when read in conjunction with the appended claims and attached drawing.

DESCRIPTION OF THE PREFERRED EMBODIMENT

Figure 3:
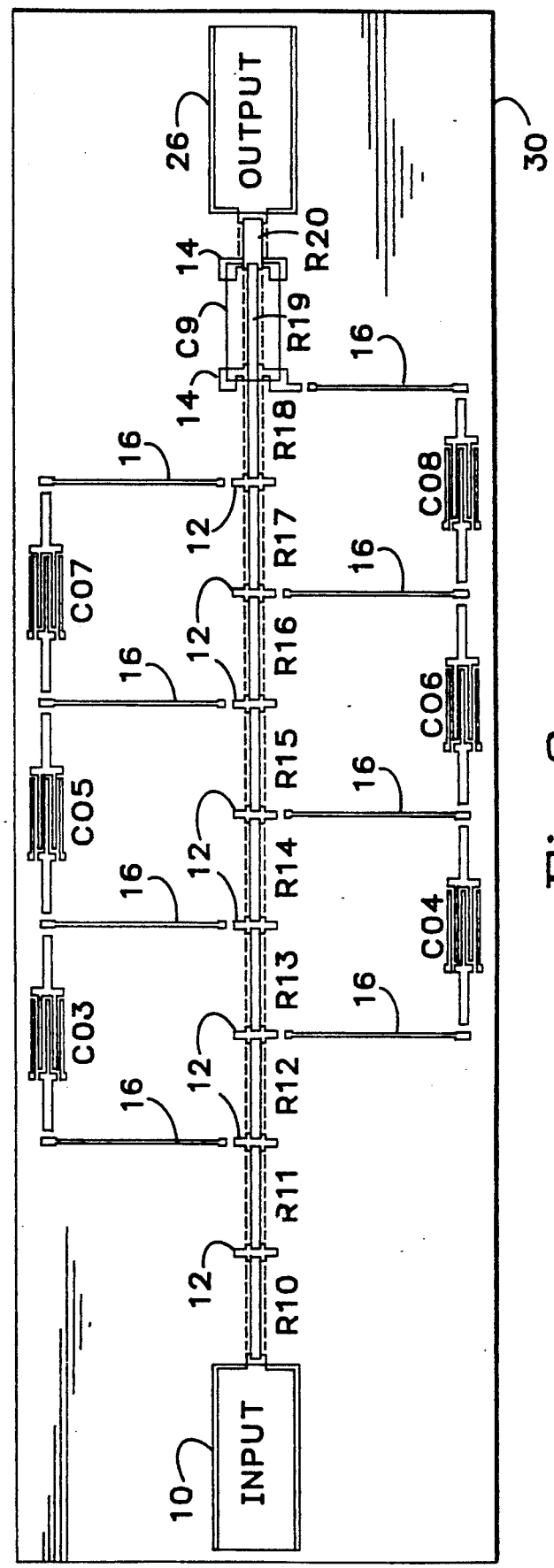
FIG. 3 is a top plan view of an attenuator probe according to the present invention.
Figure 4:
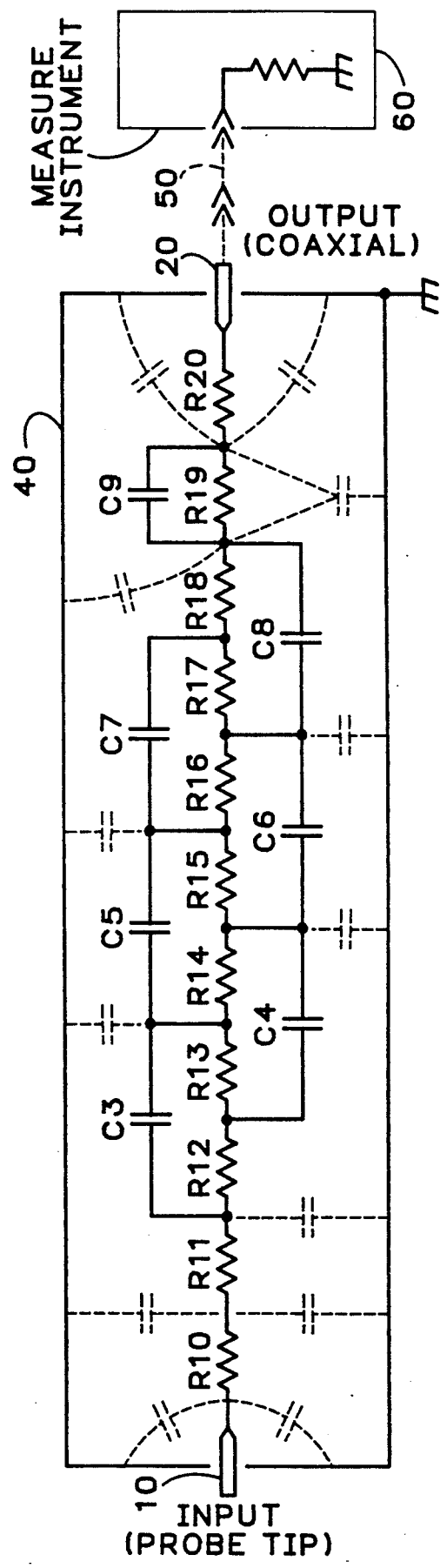
FIG. 4 is a schematic view of the attenuator probe of FIG. 3 according to the present invention.

Referring now to FIGS. 3 and 4 conductive input and output pads 10, 20 are laid on a thin-film substrate 30, such as beryllium oxide (BeO), at opposing ends. A plurality of resistors R10-R20 are laid out in series between the input and output pads 10, 20. Between each pair of resistors R10-R18 is a connection pad 12, and between the last two pairs of resistors R18-R20 are larger capacitor connection pads 14. The first resistor R10 is coupled to the input pad 10, and the last resistor R20 is coupled to the output pad 20. When the substrate 30 is placed in a metallic housing 40, the result is a transmission line between the input and output pads 10, 20 made up of the plurality of resistors R10-R20 coupled in series. A plurality of interdigitated capacitors C3-C8 are laid on the substrate 30 on opposite sides of the series of resistors R10-R20. Connective runs 16 are also laid on the substrate 30 to provide means for coupling the capacitors C3-C8 in parallel with appropriate pairs of resistors R12-R18 in an interleaved fashion.

Figure 1:
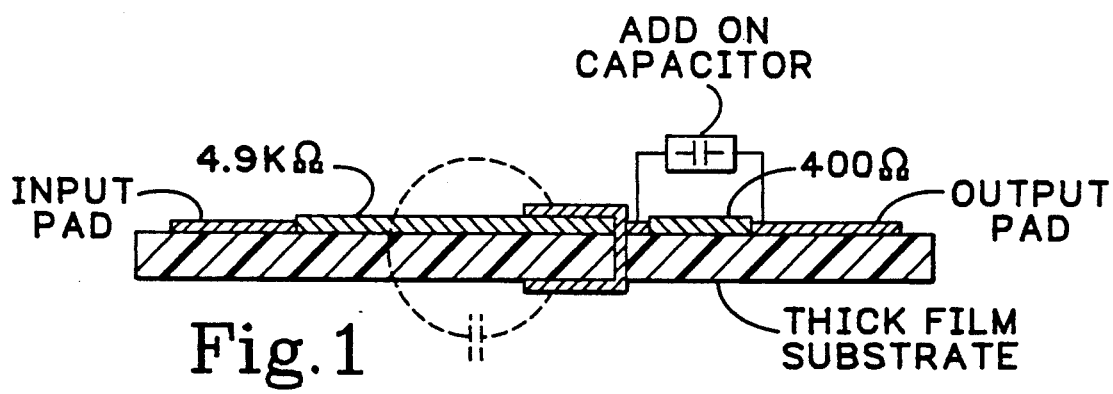
FIG. 1 is a cross-sectional view of a prior art probe attenuator.
Figure 2:
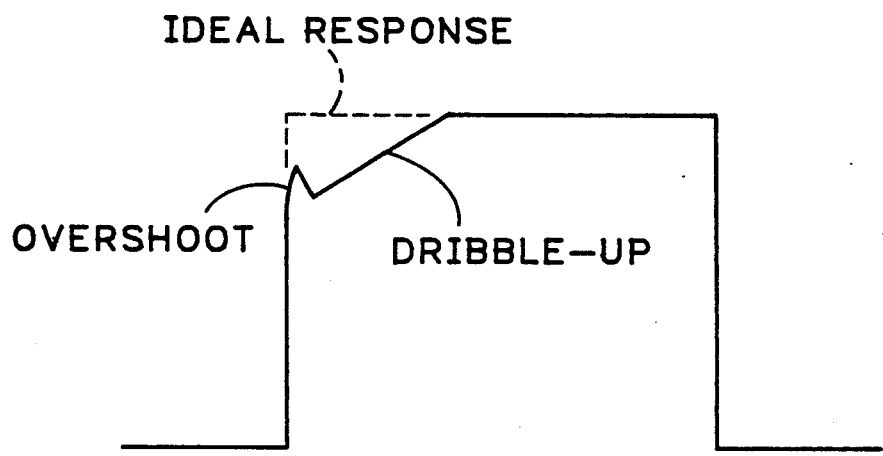
FIG. 2 is an illustrative view of the response of the prior art probe attenuator to a pulse input.
Figure 5:
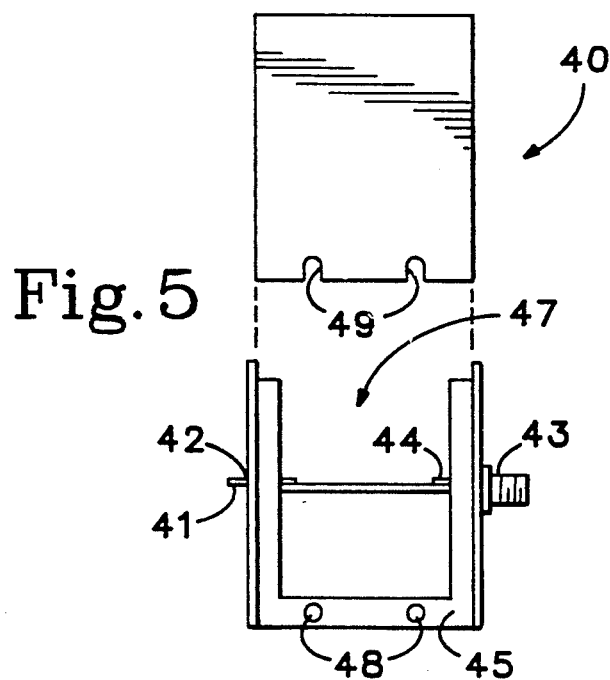
FIG. 5 is a side plan view of the attenuator probe according to the present invention mounted in a conductive housing.

In operational use a probe tip is coupled to the probe attenuator by coupling a probe conductor 41 to the input pad 10 via an external opening 42 in the housing 40, as shown in FIG. 5. The housing 40 has a body portion 45 open on three sides and a cover 46 that, when in place, encloses those three sides to form an internal cavity 47. The cover 46 is secured by any suitable means, such as screws 48 that align with slots 49 in the edge of the cover. At the opposite end of the housing 40 is an SMA coaxial connector 43 having a center conductor 44 coupled to the output pad 20 and the outer conductor coupled to the housing body 45. The substrate 30 is suspended within the cavity 47 by the connections to the probe conductor 41 and the center conductor 44 to provide a rugged structure and to provide the transmission line between the input and output of the probe attenuator when the cover 46 is secured in place. A coaxial cable 50 is coupled between the SMA connector 43 and a measurement instrument 60. The outer conductor of the coaxial cable 50 couples the housing 40 to the instrument ground. The coaxial cable 50 is a larger size than prior probe cables, being on the order of >RG58. The interdigitated capacitors C3–C8 are coupled to the appropriate junctions between the resistors R11–R19 by bond wires. The capacitor values are determined by how many leaves of the interdigitated capacitors C3–C8 at one end are coupled together. The leaves also are coupled together by appropriate bond wires. By distributing the frequency compensation over a plurality of sections, high speed is attained without overshoot. The final capacitor C9 may be physically omitted due to the stray capacitance with the housing end walls. In any event the value of the final capacitor C9 is smaller than that in prior probes due to the contribution made by the stray capacitance.

The result is an attenuator probe having no dribble-up or overshoot by using a larger coaxial cable to reduce skin effects, and by spreading the frequency compensation over a plurality of sections of the attenuator.

What is claimed is:

1. A probe attenuator comprising:

a plurality of resistors coupled in series between an input and an output to form a transmission line;

a plurality of capacitors coupled in parallel with different pairs of the resistors such that each capacitor spans a different pair of resistors with at least one individual resistor being spanned by two different capacitors; and means for coupling an extra capacitor across an output one of the resistors.

2. A probe attenuator as recited in claim 1 further comprising:

a conductive housing surrounding the resistors and the capacitors to form the transmission line, stray capacitance from the conductive housing forming an additional capacitor.

3. A probe attenuator as recited in claim 1 further comprising:

a fixed capacitor coupled across the output one of the resistors by the coupling means as the extra capacitor.

4. A probe attenuator as recited in claim 1 further comprising:

a coaxial cable having a size greater than RG58 coupled to the output for connecting the probe attenuator to a measurement instrument.

5. A probe attenuator as recited in claim 1 further comprising a thin-film substrate upon which the resistors, capacitors and interconnections between them are laid.

* * * * *